United States Patent [19]

Dussault et al.

[11] Patent Number: 5,037,208
[45] Date of Patent: Aug. 6, 1991

[54] IMMERSIBLE TRANSDUCER ASSEMBLY

[75] Inventors: Jean-Guy M. Dussault, Southbury; John E. Willey, West Haven, both of Conn.

[73] Assignee: Branson Ultrasonics Corporation, Danbury, Conn.

[21] Appl. No.: 624,607

[22] Filed: Dec. 10, 1990

Related U.S. Application Data

[62] Division of Ser. No. 335,103, Apr. 6, 1989, Pat. No. 4,979,994.

[51] Int. Cl.$^5$ .................................................. B08B 3/12
[52] U.S. Cl. .................................... 366/127; 134/184; 310/336
[58] Field of Search .................... 366/127; 134/1, 184; 68/3 SS; 310/336

[56] References Cited

U.S. PATENT DOCUMENTS

| | | | |
|---|---|---|---|
| 2,873,392 | 2/1959 | Rich | 366/127 X |
| 3,318,578 | 5/1967 | Branson | 134/1 X |
| 3,700,937 | 10/1972 | Rissolo | 366/127 X |
| 3,872,332 | 3/1975 | Butter | 310/363 X |
| 3,985,344 | 10/1976 | McCord | 366/127 |
| 4,349,762 | 9/1982 | Kitamura et al. | 310/332 |
| 4,703,656 | 11/1987 | Bhardwaj | 310/336 X |

Primary Examiner—Philip R. Coe
Attorney, Agent, or Firm—Polster, Polster and Lucchesi

[57] ABSTRACT

A method and apparatus for cleaning printed electrical circuit boards having surface mount components by ultrasonic energy in the frequency range between 300 kHz and 1.0 MHz. The ultrasonic energy is produced by an array of piezoelectric wafers mounted to the inside surface of an immersible transducer assembly which, in turn, is disposed in a tank accommodating a bath of cleaning liquid. The ultrasonic energy provided by the transducer assembly and the circuit board to be cleaned are disposed to cause the ultrasonic wave beam to be incident upon a board to be cleaned at an angle of 90±60 degrees relative to the surface plane of the board. This arrangement will remove solder flux residue and other contaminants from spaces ranging from 0.001 to 0.010 inch present underneath a surface mount component.

11 Claims, 2 Drawing Sheets

IMMERSIBLE TRANSDUCER ASSEMBLY

This is a divisional of copending U.S. application Ser. No. 07/335,103, filed on Apr. 6, 1989, and now U.S. Pat. No. 4,979,944.

BRIEF SUMMARY OF THE INVENTION

This invention concerns cleaning of workpieces by ultrasonic wave energy and, more specifically, relates to the cleaning of printed electronic circuit boards having surface mount components in a liquid cleaning bath using ultrasonic energy in the frequency range of several hundred kHz to one MHz. The object of such cleaning is to remove solder flux residue and other contamination from underneath the surface mounted components in spaces ranging from 0.001 to 0.010 inch. An important aspect of this invention resides in the orientation of the circuit board relative to the propagation of ultrasonic energy. In a preferred arrangement the ultrasonic energy beam is caused to be incident on the circuit board at an angle substantially normal to the surface plane of the circuit board.

DISCUSSION OF PRIOR ART

Conventional cleaning using ultrasonic energy in the range from 20 to 50 kHz is well known in the art, see for instance "Ultrasonic Engineering" (book) by Julian R. Frederick, pp. 130-143, John Wiley & Sons, Inc., New York, N.Y., 1965. Such cleaning makes use of the cavitational effects, the creating and collapse of gas bubbles, in the liquid cleaning solution into which the article to be cleaned is immersed. Cavitation dislodges the contaminant from the surface of the article and, as is well understood, dislodges contaminants also from small crevices and otherwise hidden surfaces.

Ultrasonic energy is produced by transducers which are attached to the underside of the cleaning vessel, or to one or more sidewalls of the vessel. In other cases, the transducers are attached to an inside surface of a sealed stainless steel enclosure which is immersed in the cleaning vessel. The latter transducers are known as immersible transducers and are energized from a remote power supply by a watertight electrical cable and liquid proof connector on the enclosure, see "Ultrasonics in Industry", by E. B. Steinberg, Proceedings of the IEEE, vol. 53, no. 10, Oct. 1965, pp. 1298-1299.

For cleaning delicate electrical semiconductor components and removing smaller contaminants, the normal frequency range of 20 to 50 kHz has been found to be inadequate. The rather significant high energy shock waves caused by cavitation may be destructive to delicate components and may break electrical connections. Hence, there has been a trend toward higher frequencies when cleaning delicate electronic components and, coincidentally, it has been observed that microscopic and submicroscopic contaminants can be removed even more effectively by the use of those higher ultrasonic frequencies, see "Frequency Dependence of Ultrasonic Cleaning" by D. H. McQueen, "Ultrasonics" (magazine), 1986, vol. 24, September, pp. 273-282, Butterworth & Co., Ltd. (Publishers). A cleaning apparatus for silicon wafers utilizing ultrasonic energy is shown in U.S. Pat. No. 3,893,869 issued to Alfred Mayer et al., dated July 8, 1975, entitled "Megasonic Cleaning System". This patent discloses the use of ultrasonic energy in the range from 0.2 to 5 MHz. As contrasted with the arrangement disclosed hereafter, the ultrasonic energy in the patent stated is propagated in a direction which is substantially parallel to the surface of the semiconductor wafers disposed in the liquid. The same frequency range, namely 0.2 to 5 MHz, is disclosed also in U.S. Pat. No. 4,326,553 issued to William B. Hall, entitled "Megasonic Jet Cleaner Apparatus" dated April 27, 1982. While, as shown in that patent, the liquid jet stream carrying ultrasonic energy is incident upon a semiconductor wafer at an angle of ninety degrees to the wafer surface, the prior arrangement differs from the present invention in several important aspects.

The present invention does not employ or require a stream of pressurized liquid carrying ultrasonic energy, does not rotate the workpiece about a central axis and, importantly, uses a different ultrasonic energy transducer arrangement. In fact, a pressurized liquid stream used heretofore in the industry for cleaning surface mount component boards has been found to be less effective and, moreover, is likely to cause physical damage to the delicate components and connections.

The present invention concerns the removal of microscopic, submicroscopic, and soluble contaminants from hidden spaces ranging as small as 0.001 to 0.010 inch present on completed electronic circuit boards having surface mount components and discloses a novel arrangement of components and conditions for achieving such cleaning action in an efficient and economic manner.

One of the important objects of this invention, therefore, is the provision of a new and improved method and apparatus for removing contaminants from electronic circuit boards having surface mount components.

Another important object of this invention is the provision of a new and improved method and apparatus for removing contaminants from electronic circuit boards having surface mount components using ultrasonic energy in the frequency range from several hundred kilohertz to one megahertz and propagated in a bath of cleaning liquid.

Another important object of this invention is the provision of a new and improved method and apparatus for removing solder flux residue and other contamination from electronic circuit boards carrying surface mount components utilizing ultrasonic energy propagated in a liquid bath into which such a circuit board is immersed, the energy being propagated from an immersible transducer assembly, and the physical orientation of the circuit board relative to the beam of ultrasonic energy being such as to obtain optimum results.

Further and still other objects of this invention will become more clearly apparent from the following description when read in conjuction with the accompanying drawings.

DETAILED DESCRIPTION OF THE INVENTION

Figures 1, 2:
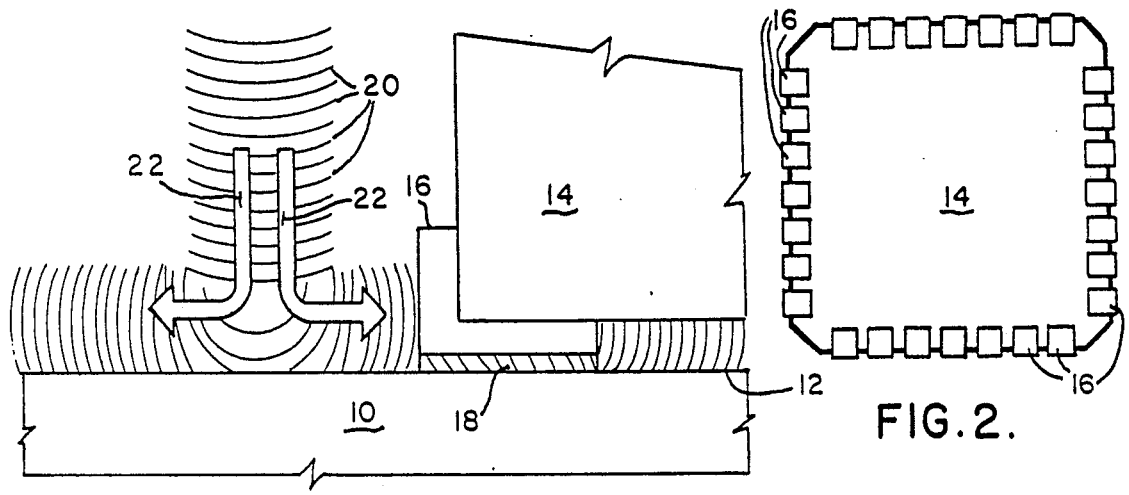
FIG. 1 is a schematic sketch for explaining the action of the ultrasonic energy beam at the operating frequency of the present arrangement.
FIG. 2 is a plan view of the underside of a surface mount component for illustrating the areas to be cleaned.

Referring now to the figures and FIGS. 1 and 2 in particular, there is shown in a schematic manner a printed electronic circuit board 10, also known as substrate, upon which surface 12 are mounted one or more surface mount components, such as component 14. Each component is secured and electrically connected to the board by means of a plurality of pads 16 and a layer of solder 18. The space between the underside of the component 14 and the surface 12 of the circuit board 10 ranges only from about 0.001 to 0.010 inch, whereas in through-hole component circuit boards, the older board construction, the space ranges from 0.010 to 0.100 inch, a factor of ten. FIG. 2 shows the underside of a surface mount component having twenty-eight pads 16 spaced along the edge of the component 14. The object of the present invention is to clean solder flux residue and other contaminants in a fast, economic and safe manner from the tiny spaces between the pads 16 as well as from the flat, larger area, but minute space, between the underside of the component and the surface 12 of the printed circuit board 10.

Figure 9:
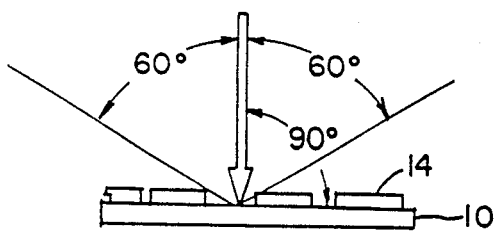
FIG. 9 is an explanatory sketch.

The present arrangement utilizes a continuous, substantially collimated field of compact ultrasonic wave fronts 20 which effectively pump liquid at a high velocity into the space beneath the components soldered upon the surface 12 of the board 10. The rapidly changing pressure gradient produced by the ultrasonic wave beam 20, FIG. 1, accelerates the liquid's ability to dissolve the entrapped solder flux residue by continually transporting fresh liquid to the contaminated board area. In a typical example, the ultrasonic energy has a frequency of 400 kHz, but a frequency in the range from 300 kHz to 1.0 MHz could be used. An important aspect of this invention resides in the fact that the ultrasonic wave energy is incident upon the circuit board at an angle of substantially ninety degrees, to cause the energy upon impact to be redirected and caused to propagate omnidirectionally along the surface 12 of the board 10 into the space underneath the surface mount component 14, see arrows 22. While it is believed that an angle of incidence of substantially ninety degrees provides best results, it is believed that a range of $90 \pm 60$ degrees, see FIG. 9, will provide acceptable results. At smaller angles, a "shadowing" effect occurs where the closely mounted components on the board substantially inhibit or severely reduce the propragation of ultrasonic energy into the space underneath the components. Cleaning is achieved not by ultrasonic cavitation but by surface streaming of the ultrasonic energy.

Figure 3:
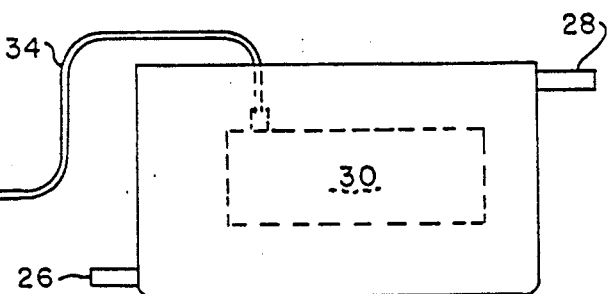
FIG. 3 is an illustration of a typical cleaning apparatus per the present invention.

FIG. 3 shows a typical apparatus of the present invention. Numeral 24 designates a stainless steel tank for holding a bath of cleaning liquid and having an inlet 26 and an outlet 28 for circulating liquid, that is, for removing contaminated liquid and supplying fresh liquid on a substantially continuous basis. An immersible ultrasonic transducer assembly 30 is disposed in the tank, in contact with the liquid and, when desired, is energized by an electrical high frequency power supply 32 via a cable 34. Of course, a water tight electrical connector is used for connecting the cable to the transducer assembly.

Figures 4, 5:
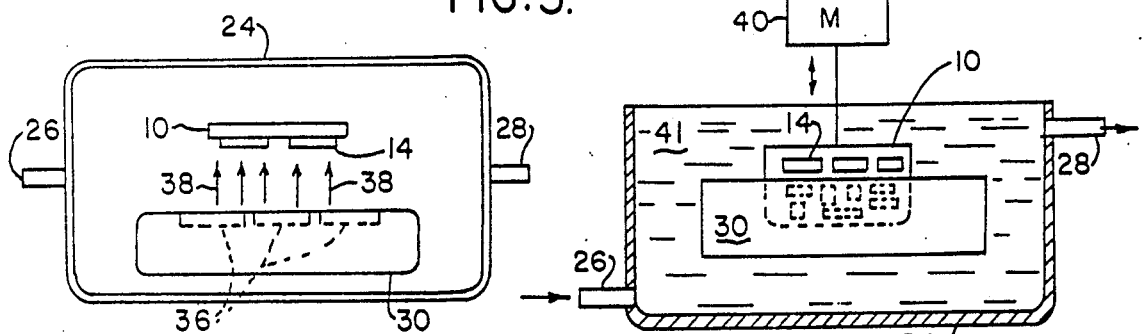
FIG. 4 is a top plan view showing a cleaning tank, the transducer and a workpiece to be cleaned in the preferred arrangement.
FIG. 5 is an elevational view of the apparatus shown in FIG. 4.

FIG. 4 is a top plan view, showing the tank 24, the printed circuit board 10 provided with a plurality of surface mount components 14 facing the immersible transducer assembly 30. The ultrasonic energy is generated by a plurality of piezoelectric wafers 36 which are disposed in a linear array and bonded to the inside surface of the front wall of the transducer assembly 30. The wafers are excited simultaneously by electrical high frequency voltage to be rendered resonant in their thickness mode of vibration to propagate ultrasonic wave energy in a generally horizontal direction toward the workpiece, i.e. board 10 and components 14, see arrows 38. As seen, the ultrasonic energy beam is incident upon the surface plane of the board 10 at an angle of substantially ninety degrees to effect cleaning as explained in connection with FIG. 1 above.

Obviously, the position of the transducer assembly could be such as to cause the ultrasonic energy to be propagated in a vertical direction, while the circuit board 10 is disposed in a substantially horizontal plane.

FIG. 5 is a vertical view, showing the circuit board 10 with components 14 thereon coupled to motive means 40, such as a loop transport mechanism, for moving the board vertically or horizontally, or both, in the liquid 41 and relative to the ultrasonic energy beam for enhancing the cleaning action and for providing a continuous transport of boards to be cleaned in and out of the cleaning tank 24.

Figure 6:
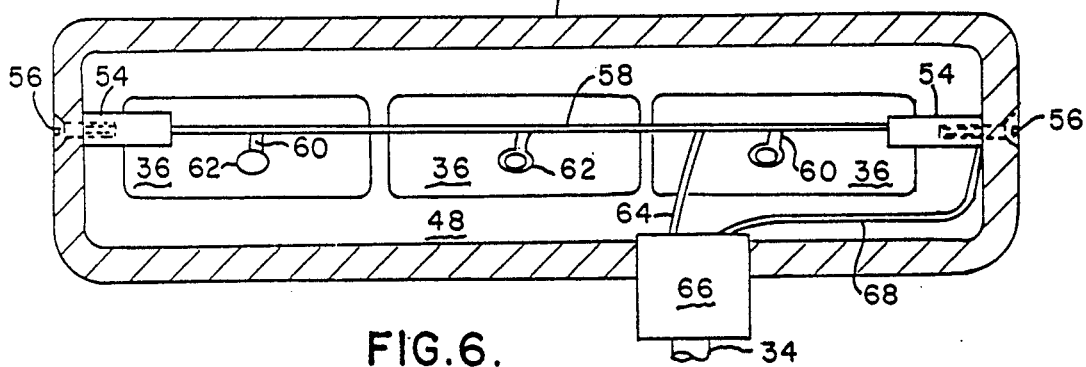
FIG. 6 is a plan view, partly in section, of the immersible transducer assembly.
Figure 7:
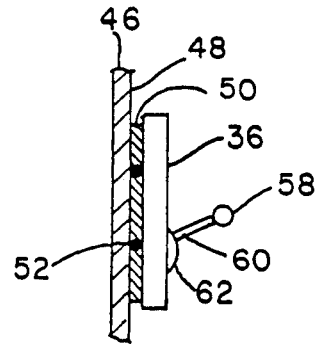
FIG. 7 is a detail view for explaining the bonding of the transducer wafer to the inside of the front cover plate of the transducer assembly.
Figure 8:
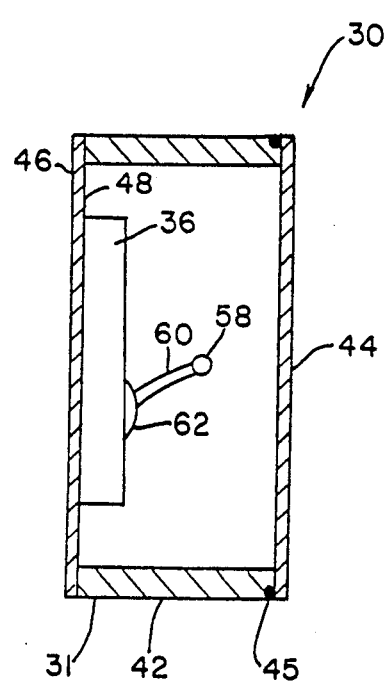
FIG. 8 is a sectional view of the transducer assembly.

FIGS. 6, 7, and 8 concern the detailed construction of the immersible transducer assembly specifically developed for the present ultrasonic cleaning method. It must be kept in mind that the combination of the thickness of the piezoelectric wafer and that of the plate to which the transducers are attached must be dimensioned to cause the wafer when energized with electrical energy of predetermined frequency to become resonant. Assuming, for instance, a frequency of 400 kHz in the present example, both the wafer and the front wall of the transducer housing are relatively thin for forming a half wavelength resonator at the stated frequency.

The transducer assembly 30, FIG. 8, includes a substantially rigid, open ended, tubular shell 42, about 0.250 inch thick, stainless steel, rectangular cross-section with rounded corners. The back plate 44, also of stainless steel, is about 0.060 inch thick and closes one end of the shell by being welded thereto as indicated by numeral 45. The front plate 46, in contrast, is quite thin, approximately 0.015 inch thick, and made also from stainless steel. The front plate 46 has bonded to its inside surface 48 the piezoelectric wafer 36. In order to avoid distortion of the front plate due to stress and damage to the piezoelectric wafer, the front plate 46 with wafer bonded thereto is secured to the rigid shell 42 by brazing, using a nickel alloy, in a vacuum furnace. Alternatively, epoxy resin could be used for this joint. It shall be noted that the shell 42 provides the necessary mechanical rigidity for the housing 31 formed by the shell and plates. There is disposed in the transducer housing 31, comprising the shell 42 and end plates 44 and 46, a linear array of piezoelectric wafers 36, FIG. 6, each wafer being about 3 inch long by 1½ inch wide by 0.200 inch thick. Each wafer 36 is of rectangular shape, but could also be of square shape. The more common circular disc shape for piezoelectric wafers is avoided for the present application due to resulting gaps between the circular ultrasonic beams as contrasted with the rectangular beam profile desired in the present construction. Each wafer 36, three wafers being used as shown in FIG. 6, is bonded to the inside surface 48 of the front plate by the use of a thin layer of electrically conductive epoxy resin 50, typically part No. CT-4042-5 of W. R. Grace & Co. - Emerson - Cuming. The conductivity of the resin provides electrical ground connection from one side of the wafer to the stainless steel housing 31, see FIG. 7. A pair of spaced, bare copper wires, used as thickness spacers, are disposed between the wafer 36 and the surface 48 for controlling and standardizing the thickness of the epoxy resin layer. Typically, the wires are 0.002 inch in diameter. At each end of the transducer assembly there is disposed a respective electrical insulator 54, see FIG. 6, each secured to the shell 42 by a respective screw 56. The opening made in the shell for the screw is sealed, as by welding, after the screw is in place. A copper buss wire 58 spans the open space between the insulators. The rear and exposed side of each piezoelectric wafer is electrically connected to the buss wire 58 by a respective conductor, such as a tubular braided copper sleeve 60, soldered at one end to the buss wire 58 and soldered at the other end to the exposed side of the wafer 36, see numeral 62. The braided conductor on account of its flexibility avoids mechanical stress on the connection. An electrical conductor 64 connects the high voltage potential from the connector 66 to the buss wire 58, and a grounding conductor 68 leads from the screw 56, or any other suitable fastening means attached to the metal transducer housing 31, to the connector 66.

When the transducer housing 31 with its components is inserted into a tank 24 with suitable cleaning liquid, and electrical energy of the predetermined frequency is applied, for instance 400 kHz, the piezoelectric wafers are excited and an ultrasonic wave front of rectangular cross section is generated. This ultrasonic energy is propagated toward the circuit board 10 as shown in FIGS. 1 and 4 to effect satisfactory cleaning.

A modification possible in the present arrangement comprises moving the transducer assembly 30 relative to the workpiece instead of the workpiece.

Another modification, for example, concerns the replacement of the spacing wires 52 by glass beads, or woven glass fibers. The advantage of the copper wires resides in the fact that they are dimensionally accurate and electrically conductive.

Figure 10:
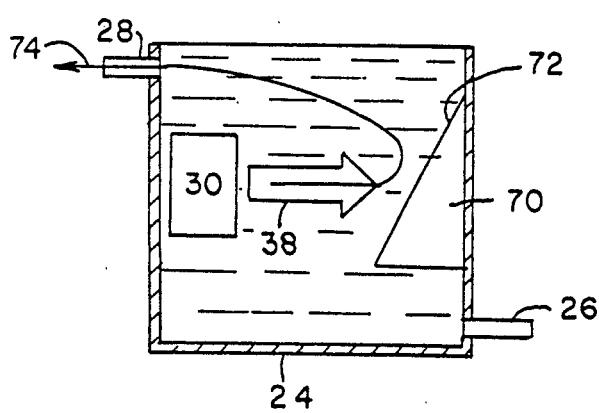
FIG. 10 is an elevational view, partly in section, of a modification of the tank.

FIG. 10 shows another modification. The tank 24 is provided with a reflecting baffle 70 having an inclined surface 72. The inclined surface is arranged to expedite the flow of contaminated liquid in the upward direction and out of the tank through outlet 28 as indicated by line and arrow 74. Arrow 38 indicates the direction of the ultrasonic energy propagated from the transducer assembly 30 toward the surface 72.

Figure 11:
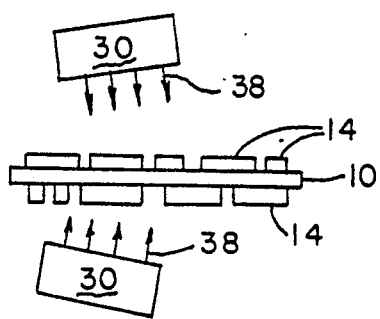
FIG. 11 is a sketch illustrating a modification.

When a circuit board 10 is provided with components 14 on both sides of the board, it will be advantageous to dispose a transducer assembly 30 on either side of the board, each transducer assembly transmitting ultrasonic energy to a respective side as illustrated in FIG. 11.

In the preferred embodiment, the tank 24 and the housing 31 of the transducer assembly 30 are made from stainless steel. Other suitable materials may be used without departure from the present invention.

While there has been described and illustrated a preferred embodiment of the present invention and several modifications have been indicated and illustrated, it will be apparent to those skilled in the art that various further changes and modifications can be made without departing from the broad principle of this invention, which shall be limited only by the scope of the appended claims.

What is claimed is:

1. An immersible transducer assembly comprising:
a liquid tight metal housing having a front plate;
a plurality of rectangular shaped piezoelectric wafers bonded to the inside surface of said front plate and forming a linear array;
a buss wire spanning the inside of said housing;
electrical conductor means electrically connecting said wire with the exposed side of each of said wafers;
a set of insulating means disposed inside said housing and mechanically fastened to said housing and supporting said buss wire;
an electrical connector disposed on said housing, and electrical conductor means establishing electrical connection from said connector to said buss wire and from said connector to said housing.

2. An immersible transducer assembly as set forth in claim 1, the thickness of said wafers and the thickness of said front plate being dimensioned to cause said piezoelectric wafers when energized with electrical energy to be resonant at a predetermined frequency in the range between 300 kHz and 1.0 MHz.

3. An immersible transducer assembly as set forth in claim 2, said wafers being bonded to said inside surface by electrically conductive epoxy resin.

4. An immersible transducer assembly as set forth in claim 3, and spacing means disposed between each of said wafers and the inside surface of said front plate for controlling the thickness of said epoxy resin.

5. An immersible transducer assembly as set forth in claim 4, said spacing means comprising a pair of bare copper wires.

6. An immersible transducer assembly as set forth in claim 1, said electrical conductor means electrically connecting said buss wire with the exposed side of each of said wafers comprising a braided conductor.

7. An immersible transducer assembly as set forth in claim 6, said braided conductor being a braided tubular sleeve conductor.

8. An immersible transducer assembly as set forth in claim 1, said housing comprising a tubular shell of substantially rectangular shape, said front plate disposed to cover one end of said shell, and a back plate disposed to cover the opposite end of said shell.

9. An immersible transducer assembly as set forth in claim 8, said shell having a wall thickness which is at least ten times the thickness of said front plate.

10. An immersible transducer assembly as set forth in claim 9, said front plate being secured to said shell by a brazed joint, and said back plate being welded to said shell.

11. An immersible transducer assembly as set forth in claim 9, said back plate having a thickness which is greater than that of said front plate but thinner than that of said shell.

* * * * *